United States Patent [19]

Zimmerman

[11] 4,048,438
[45] Sept. 13, 1977

[54] CONDUCTOR PATTERNED SUBSTRATE PROVIDING STRESS RELEASE DURING DIRECT ATTACHMENT OF INTEGRATED CIRCUIT CHIPS

[75] Inventor: Richard Henry Zimmerman, Palmyra, Pa.

[73] Assignee: AMP Incorporated, Harrisburg, Pa.

[21] Appl. No.: 633,045

[22] Filed: Nov. 18, 1975

Related U.S. Application Data

[63] Continuation-in-part of Ser. No. 517,573, Oct. 23, 1974, abandoned.

[51] Int. Cl.² .......................... H05K 1/02; H01L 23/48
[52] U.S. Cl. ..................................... 174/68.5; 29/625; 357/70
[58] Field of Search ............. 174/52 FP, 52 S, 52 PE, 174/68.5; 357/68-70; 29/625, 626, 628, 588-591, 577

[56] References Cited

U.S. PATENT DOCUMENTS

| | | | |
|---|---|---|---|
| 3,052,823 | 9/1962 | Anderson et al. | 317/101 CM |
| 3,256,465 | 6/1966 | Weissentern et al. | 174/52 FP |
| 3,390,308 | 6/1968 | Marley | 317/101 CC |
| 3,544,857 | 12/1970 | Byrne et al. | 174/52 FP |
| 3,683,105 | 8/1917 | Shamash et al. | 317/101 CC |
| 3,689,991 | 9/1972 | Aird | 174/52 FP |
| 3,778,686 | 12/1973 | Galvin | 174/52 FP |
| 3,781,596 | 12/1973 | Galli et al. | 317/101 F |
| 3,795,043 | 3/1974 | Farlani | 29/591 X |
| 3,838,984 | 10/1974 | Crave et al. | 174/52 FP |

*Primary Examiner*—Bruce A. Reynolds
*Attorney, Agent, or Firm*—Russell J. Egan

[57] ABSTRACT

An improved conductor patterned substrate assembly is disclosed which permits direct attachment of integrated circuit chips to a metallized array while preventing stress buildup due to thermal cycling and/or bonding temperatures. A circuit is formed on a flexible substrate of insulative material which is suitable for withstanding solder, thermal compression bonding, or eutectic die attachment temperatures. The circuit includes a fine line pattern of leads extending up to the edge of a hole in the substrate substantially centered within the pattern of the integrated circuit pad dimensions. The subject assembly can thus be used face down bonding of integrated circuit chips which have bump metallization on the contact pads thereof. Thermal distortion of the substrate during bonding is minimized by the central hole thus preventing undue stresses from being applied to the chip bonds by the substrate. The assembly also provides for full support for the conductor leads throughout their entire length, in order to maintain dimensional and spacial stability especially for bonding larger multi-pad chips.

11 Claims, 6 Drawing Figures

U.S. Patent  Sept. 13, 1977  Sheet 1 of 3  4,048,438
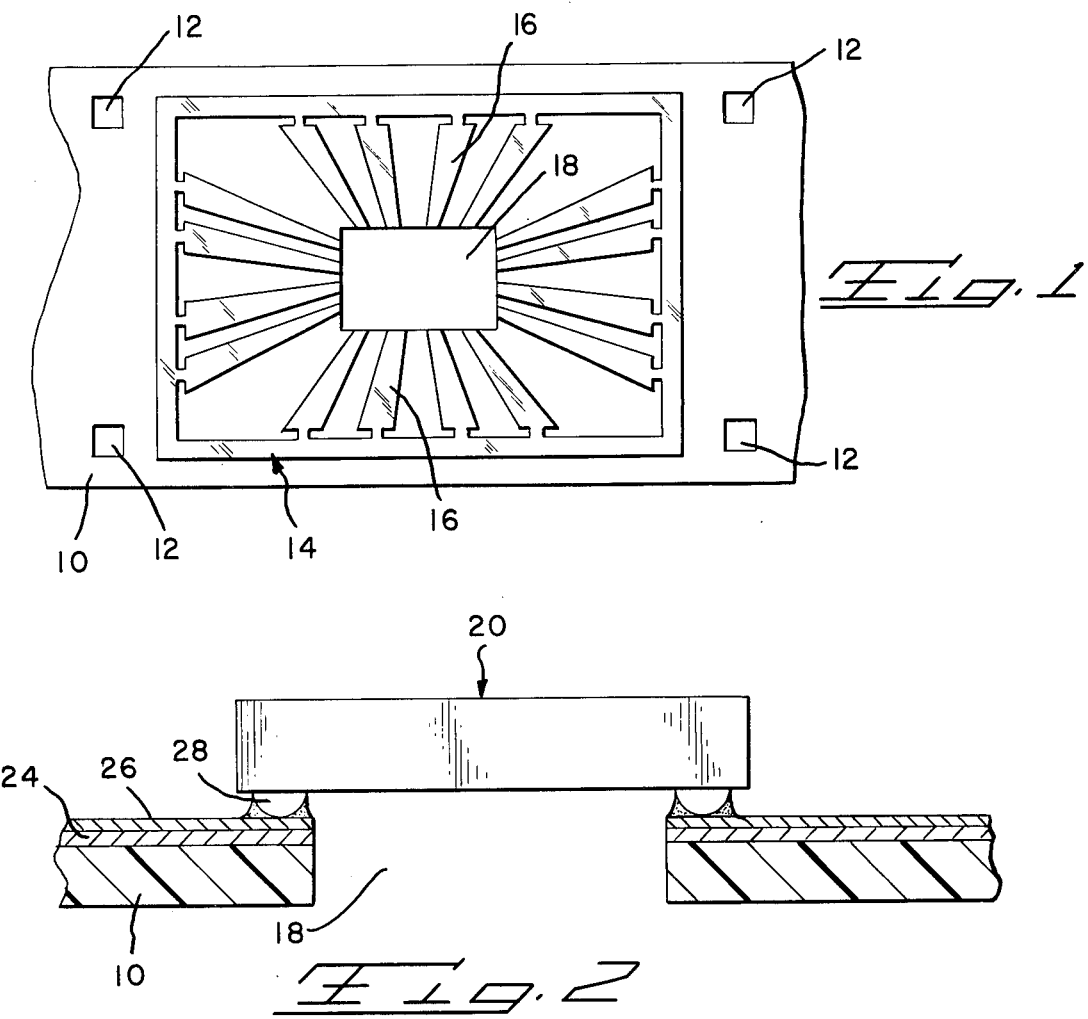
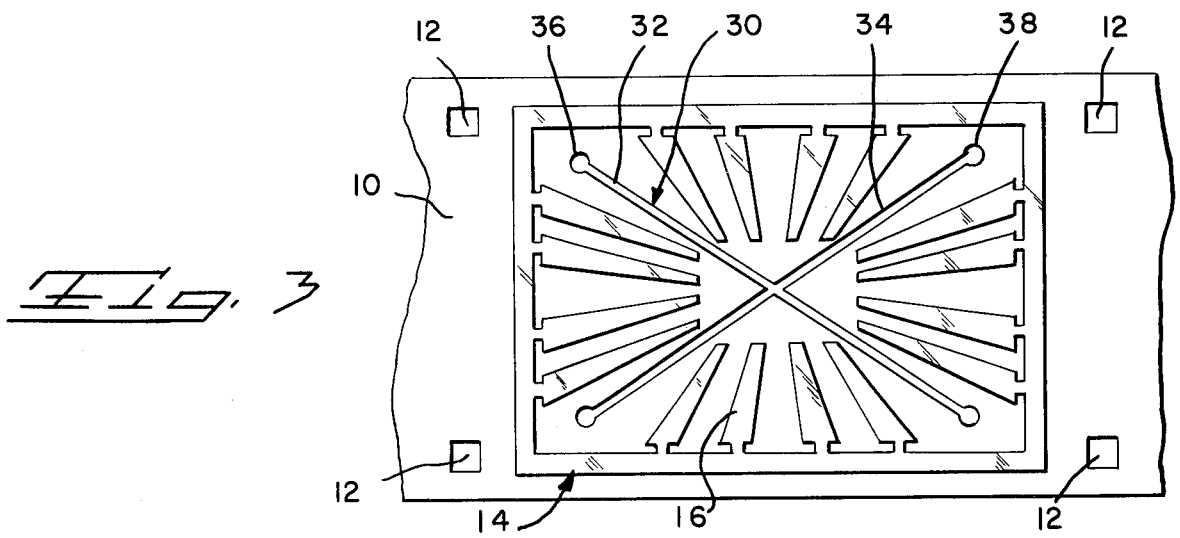

CONDUCTOR PATTERNED SUBSTRATE PROVIDING STRESS RELEASE DURING DIRECT ATTACHMENT OF INTEGRATED CIRCUIT CHIPS

CROSS REFERENCE TO RELATED APPLICATION

The present application is a continuation-in-part of my application Ser. No. 517,573 filed Oct. 23, 1974, abandoned.

BACKGROUND OF THE INVENTION

1. The Field Of The Invention

The present invention relates to an improved conductor pattern for receiving integrated circuit chips directly attached thereon and in particular to an improved configuration of a metallized pattern of leads on a flexible insulator substrate which supports the individual leads throughout their entire length and yet provides stress relief for the connection points between the pattern and devices attached thereto.

2. The Prior Art

A well known metal lead frame device and its method of manufacture are described in U.S. Pat. No. 3,440,027. This lead frame has fully supported conductors disposed on a flexible insulator substrate. U.S. Pat. Nos. 3,689,991 and 3,763,404 both show another type of lead frame which is commonly known as a beam-over-hole lead frame. According to these patents, at least a portion of each conductor extends in cantilever fashion over a hole in the flexible substrate. Both the fully supported and the beam-over-hole types of lead frames have a number of disadvantages. For example, the fully supported type has the particular disadvantage that undue stresses can build up on the leads themselves due to differential thermal expansion between the metallic leads and the insulative substrate when heat is applied to bond a chip thereto and/or by thermal variations during normal use. The heat can cause sufficiently large distortion of the substrate during the bonding of the leads to the chip to cause the bonded joint to be defective or to even break the chip during later thermal cycling, should the bonds be of sufficient strength. This is especially true with large multiple bonded structures such as MSI and LSI. The beams-over-hole arrangement described in the other two patents does not have the above-discussed problem of undue stress buildup but instead has a problem of supporting the beams, during fabrication and handling, in a coplanar predetermined array prior to the bonding of chips thereto. There is a further disadvantage in this arrangement in that the leads can be easily and permanently damaged prior to their use, thus substantially increasing waste and cost.

Apparatus of a type suitable for attached lead frames of the above-described types are shown in U.S. Pat. Nos. 3,317,287, and 3,724,068.

The conventional method of attaching integrated circuit chips to a circuit has been a two step process. First the chip is bonded to a lead frame of one of the known types. This subpackage is then separated from a carrier and bonded to the final circuit. Clearly this method has the disadvantage of multiple handling steps during which the leads can easily be misaligned making the package useless.

There are many well known additive and subtractive methods for forming electrical circuitry of the subject lead type on either flexible or rigid insulating substrates. The primary disadvantage of the known additive methods is that they are relatively slow in that they all require an electroless deposition step to plate the metal layer on the substrate. These known additive methods generally are similar in that they comprise the steps of coating a non-conductive flexible or rigid substrate with a photo resist material, exposing a circuit pattern to the photo resist, and stripping away the photo resist to leave a circuit pattern that can be plated. The prepared substrate, after catalyzing the pattern by known chemical processes, is then placed in an electroless plating tank and allowed to stand until a sufficient buildup of metal occurs on the treated portions of the substrate. While the known additive methods have proved to be quite satisfactory in forming electrical circuits, they are all relatively slow as compared to electroplating and using present state of the art solution technology. They also suffer from reduced adhesion between the plating and the substrate.

In the known semi-additive methods, a substrate is completely blanket metallized to a sufficient thickness to be conductive. A photo resist is applied, exposed and developed and the circuitry is electroformed and covered with an etch resistant metal as the top layer. The photoresist is then removed and the initial blanket metallization etched away leaving only the desired circuitry.

Another known method for forming electrical circuitry on flexible or rigid insulating substrates is the subtractive method. This method generally comprises printing a circuit pattern on a metal sheet and etching the circuit out of the sheet. The metal sheet can be laminated to an insulator substrate either before or after the etching step. There is the problem of the type of adhesive to use in order to prevent chemical attack by the etchant as well as smearing of the adhesive when a formed circuit is joined to a substrate after etching an intermediate substrate. There is also the problem of undercutting the fine conductor circuitry thus causing poor resolution of the etched pattern.

Thus the additive and subtractive techniques for forming a metallized circuit on an insulative substrate can be summarized as follows: the additive method starts with an uncoated substrate and is masked in all areas where circuitry is not desired, while the subtractive method masks those areas of a coated substrate where the circuitry is desired.

SUMMARY OF THE PRESENT INVENTION

The present invention provides a method for direct attachment of integrated circuit chips and the like to conductor patterns on flexible insulator substrates with or without any prior chip packaging. The subject method includes the steps of forming a conductor pattern on a flexible insulator substrate capable of withstanding bonding temperatures. The substrate includes at least one central aperture with the conductor pattern formed thereon including a fine line pattern of leads extending up to the edge of the hole. The central aperture provides for thermal expansion of the substrate under the chip area without putting undue strain on either the chip or the metallization joining the chip and the conductor pattern.

It is therefore an object of the present invention to produce an improved conductor pattern on a flexible insulator substrate in which the entire circuitry, including chip attachment leads, can be formed by either an additive or a subtractive process and in which there will be substantially no substrate distortion built up during attachment of a chip thereto.

It is another object of the present invention to produce an improved conductor pattern on a flexible insulator substrate in which the chip attachment leads extend up to the periphery of an aperture centrally disposed within the lead pattern on the substrate, with the aperture providing strain relief during attachment of a chip thereto.

It is a further object of the present invention to produce an improved conductor pattern on a flexible insulator substrate having means to relieve stresses due to differential thermal expansion between the conductor pattern and the substrate caused by normal use thermal cycling or bonding temperatures.

It is a further object of the present invention to provide additional stress relief for two step packaging methods where desired by the addition of slots external to the metallized pattern but within the confines of the outside dimensions of the substrate, preferably as close to the pattern as possible without weakening the structure.

It is a further object of the present invention to produce an improved conductor pattern on a flexible insulator substrate which can be readily and economically produced and will eliminate the previous requirement for mounting chips on a separate lead frame before being joined to the circuit.

The means for accomplishing the foregoing and other objects and advantages of the present invention will become apparent from the following detailed description taken with reference to the accompanying drawings.

BRIEF DESCRIPTION OF THE DRAWINGS

FIG. 1 is a plan view of a first embodiment of the subject conductor pattern on a flexible insulator substrate;

FIG. 2 is a said elevation, partially in section, the attachment of an integrated circuit chip to the subject conductor pattern of FIG. 1;

FIG. 3 is a plan view of a first alternate embodiment of the subject conductor pattern;

DETAILED DESCRIPTION OF THE PREFERRED EMBODIMENT

Figure 4:
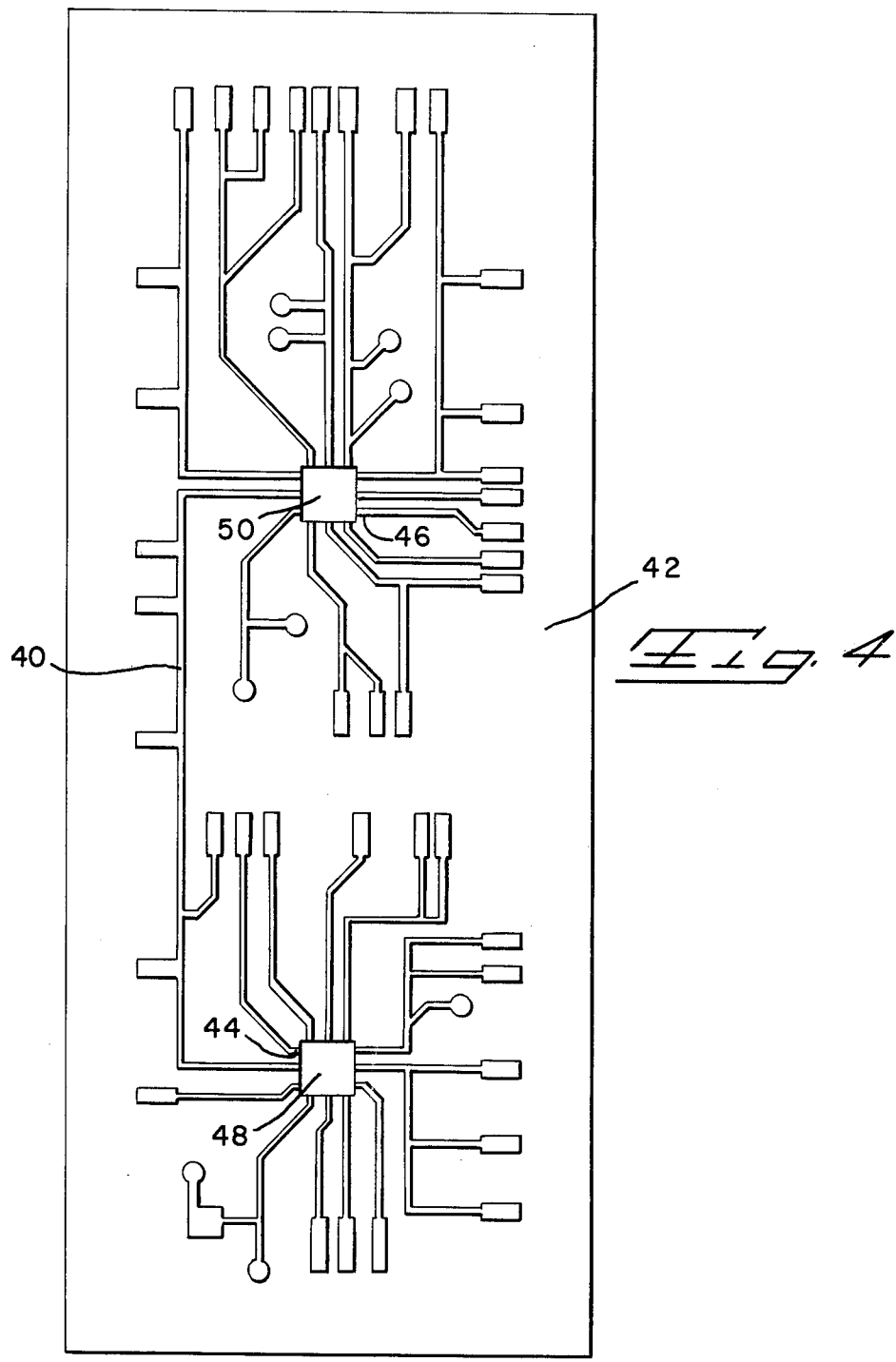
FIG. 4 is a plan view of a second alternate embodiment showing an entire circuit pattern.

The conductor pattern of the present invention is made in accordance with any of the well known additive or subtractive processes discussed above. The conductor pattern is manufactured on a flexible substrate 10 having a plurality of registration holes 12 spaced along the opposite side edges. Each individual conductor pattern 14 is formed on the substrate to have a plurality of lead fingers 16 leading up to the periphery of a central hole 18 formed in the substrate. Typically the leads might be 4 mils wide and on 8 mil centers at the edge of the hole and 30 mils wide and on up to 100 mil centers at the edge of the pattern. By fully supporting the leads in this manner, finger widths as small as 1–2 mils can be utilized. The purpose of the hole 18 is to provide stress relief for the leads when heat is applied during the bonding of an integrated circuit chip to the leads. The hole 18 can also be used for chip locating and/or alignment for registration prior to bonding.

The flexible substrate 10 can be formed of any suitable insulating material; for example, an organic resin such as the polyester known commercially as Mylar, or a polyimide such as Kapton (both products of the DuPont Company, Wilmington, Delaware). If desired, the insulating substrate may be backed or clad, for reinforcing or other purposes, with an additional strengthening layer (not shown) which may be insulative, conductive, or semiconductive. The substrate is cut into strips of usable width, for example 16 or 35 mm, and preferably has a thickness in the range of about 0.002 to 0.005 inches.

FIG. 2 shows a vertical section through the subject conductor pattern with an integrated circuit chip 20 bonded thereto. In this embodiment the flexible substrate 10 includes a polyimide insulator base 2 to 5 mils thick with a 0.125 to 3 mil copper conductor 24 formed thereon, in accordance with pattern 14, and with surface metallization 26, such as tin-lead 2 to 4 mils thick, tin or any of the noble metals, on top of the copper. The integrated circuit chip 20 has a plurality of bumped metallized pads 28 formed on the functional face thereof in positions in alignment with the lead fingers 16. The chip is bonded to the lead frame, according to known practice, by solder reflow, thermal compression or other eutectic metal attachment combinations which are commonly used.

Typically the bonding is accomplished by an operator viewing both the chip and carrier through optics. Alignment is accomplished by looking through the center hole in the film and aligning the interleads over the bumps, no chip edge alignment is required. After alignment, a bonding head is moved over the center hole, on command of the operator, and bonds all innerleads simultaneously to their respective bumps. The choice of the type of bonding head will be determined by the materials being used. However, bonding tools of a suitable type are described in U.S. Pat. No. 3,724,068. The completed assembly can then be reeled for later separation and attachment to the final circuitry, such as that shown in FIG. 4.

The embodiment shown in FIG. 3 shows an alternate configuration to the central aperture which will still obtain the desired stress relief. The substrate 10 has therein a star burst configuration 30 formed by at least two intersecting slots 32, 34 extending radially from a center location which can be round, square, or any other suitable geometric shape. Each slot has a round hole 36, 38, respectively, at each end to prevent tearing of the slot through the substrate. This star burst pattern of slots will provide the similar function as the hole 18, namely, it will compensate for stresses which build up in the leads due to differential thermal expansion.

Another alternate embodiment of the present invention is shown in FIG. 4. In this case an entire circuit pattern 40 is formed on a flexible insulator substrate 42 by the previously discussed additive or subtractive processes. Lead fingers 44, 46 of the circuit pattern extend to the peripheral edges of apertures 48, 50 which are formed in the substrate 42. Thus, according to this embodiment, integrated circuit chips and the like can be directly bonded onto the circuit pattern without first being bonded to a lead frame which must in turn be bonded to the circuit pattern.

Figure 5:
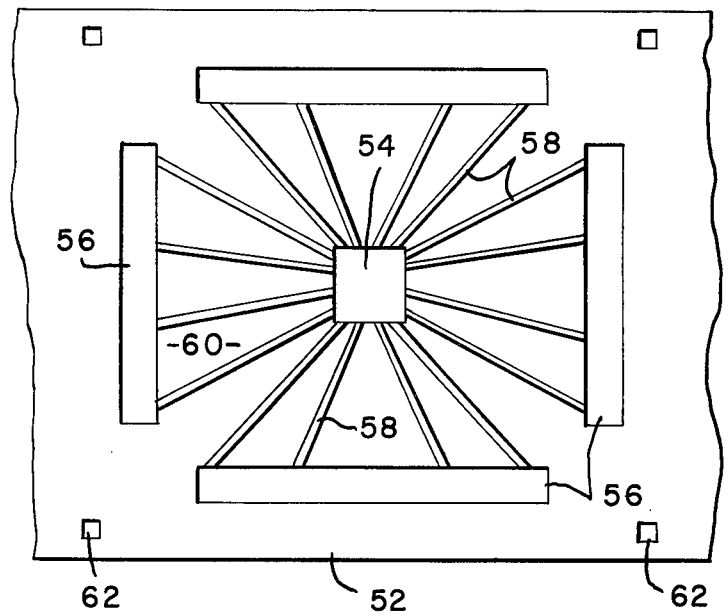
FIG. 5 is a plan view of a further embodiment having stress relief apertures outside the metallized pattern.

FIG. 5 shows a further alternate embodiment which will provide the desired stress relief. In this case the substrate 52 has a central aperture 54, a number of apertures 56 spaced from and substantially surrounding the central aperture, and a plurality of lead fingers 58 formed on the intermediate portion 60 of the substrate by any of the previously described additive or subtractive methods.

Figure 6:
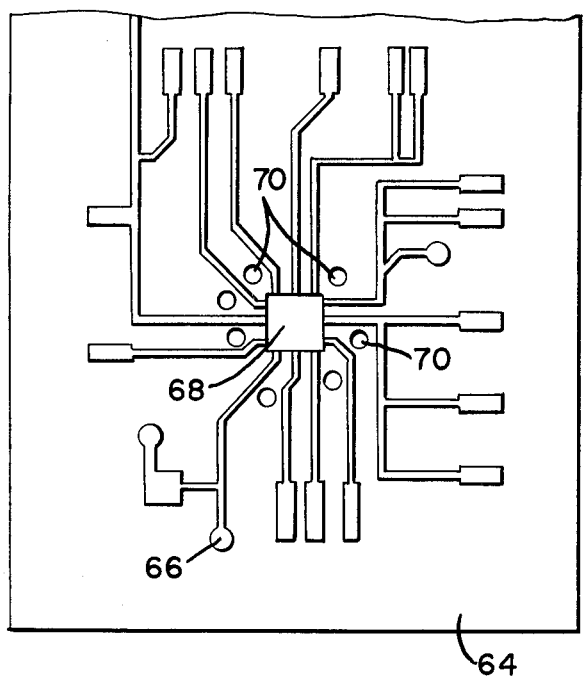
FIG. 6 is a plan view of yet another embodiment showing a portion of a circuit pattern for two step attachment of chips.

FIG. 6 is a plan view, somewhat similar to FIG. 4, showing a portion of a circuit pattern for two step attachment of chips which have had lead frames attached thereto. The substrate 64 has circuitry 66 formed thereon by the previously discussed additive or subtractive methods and has a chip receiving aperture 68 formed therein. At least one strain relieving aperture 70 is formed in the substrate spaced from and surrounding the central aperture. These apertures 70 should preferably be as close as possible to the portions of the leads where bonding will take place without weakening the substrate so that it cannot support the chip.

The present invention may be subject to many changes and modifications without departing from the spirit or essential characteristics thereof. The present embodiments are therefore to be considered in all respects as illustrative and not restrictive.

What is claimed is:

1. A circuit pattern for direct attachment to at least one semiconductor device, such as an integrated circuit chip having a plurality of terminals fixed thereon and arranged in a predetermined pattern upon one side of the chip, comprising:
   a continuous elongated web of flexible insulator material;
   a single repetitive pattern of metal having a width less than the width of said web of insulator material with each repetition of said pattern having a plurality of conductive fingers converging on at least one location;
   an aperture in said web of insulator material at each said location located centrally of said converging conductive fingers said aperture being smaller than a semiconductor device to be bonded to said circuit pattern and defined by at least two slots radiating from a single point in a star burst configuration; and
   each said repetition of said metal pattern being bonded to said flexible insulator material.

2. A circuit pattern according to claim 1 further comprising:
   at least one aperture formed in said web spaced from said centrally located aperture, said conductive fingers extending between said apertures.

3. A circuit pattern according to claim 1 further comprising:
   a plurality of registration holes formed along at least one marginal edge of said web of insulation material in regular spaced alignment.

4. A process for fabricating a patterned circuit for direct attachment to semiconductor devices, such as integrated circuit chips comprising:
   forming in a flexible insulative carrier an aperture having a periphery which is substantially smaller than that of a semiconductor device intended to be located thereover,
   securing a metallic foil to the carrier and removing portions of the foil to form on the insulative carrier a plurality of spaced finger-like leads each extending inwardly to the periphery of the aperture,
   locating over the aperture a semiconductor device having formed on a face thereof metallic contacts, the periphery of the semiconductor device extending beyond the periphery of the aperture and the metallic contacts being registered with the leads,
   simultaneously joining the inner terminations of the leads to the registered metallic contacts on the semiconductor device, and
   severing the leads beyond the device to separate the semiconductor device from the carrier.

5. A process according to claim 4 in which the inner terminations of the leads are joined to the metallic contacts of the semiconductor device by bringing a heatable bonding tool into heat transmitting position with the portions of the leads that overlie the semiconductor device, the heatable bonding tool remaining spaced from the surrounding carrier, and generating heat within the bonding tool to effect bonding.

6. A lead frame for direct attachment to at least one semiconductor device, such as an integrated circuit chip having a plurality of terminals arranged in a predetermined pattern upon one face thereof, comprising:
   a continuous elongated web of flexible insulator material;
   a single repetitive pattern of metal having a width less than the width of said insulator material with each repetition of said pattern having a plurality of conductive fingers converging on at least one location;
   an aperture in said insulator material at each said at least one location located centrally of said converging conductive fingers, said central aperture being smaller than the semiconductor device to be bonded to said circuit pattern and defined by at least two slots radiating from a single point in a star burst configuration; and
   each said repetition of said metal pattern being bonded to said flexible insulator material.

7. A lead frame according to claim 6 further comprising:
   at least one supplemental aperture formed in said web spaced from said centrally located aperture with said fingers extending therebetween.

8. A lead frame according to claim 6 further comprising:
   a plurality of registration holes formed along at least one edge of said web of insulation material in regular spaced alignment.

9. A process for fabricating a lead frame for direct attachment to semiconductor device, such as integrated circuit chips having a plurality of terminals fixed thereon in a predetermined pattern comprising the steps of:
   forming in a flexible insulative carrier an aperture having a periphery which is substantially smaller than that of a semiconductor device intended to be mounted thereon,
   securing to the insulative carrier a layer of conductive metal having the form of a plurality of spaced finger-like leads each extending substantially radially inwardly to the periphery of the aperture,
   locating over the aperture a semiconductor device having formed on one face thereof a plurality of metallic contacts in fixed predetermined array, the periphery of the semiconductor device extending beyond the periphery of the aperture and the metallic contacts being in registration with the leads, simultaneously joining the inner terminations of the leads to the respective registered metallic contacts on the semiconductor device, and severing the leads beyond the device to separate an assembly of the semiconductor device and the bonded lead frame from the rest of the carrier.

10. A process according to claim 9 in which the inner terminations of the leads are joined to the metallic contacts of the semiconductor device by bringing a heatable bonding tool into heat transmitting position with respect to the portions of the leads that overlie the semiconductor device, the heatable bonding tool remaining spaced from the surrounding carrier, and generating heat within the bonding tool to effect bonding.

11. A circuit pattern for direct attachment to at least one semiconductor device, such as an integrated circuit chip having a plurality of terminals fixed thereon and arranged in a predetermined pattern upon one side of the chip comprising:

- a continuous elongated web of flexible insulator material;
- a single repetitive pattern of metal having a width less than the width of said web of insulator material with each repetition of said pattern having a plurality of conductive fingers converging on at least one location;
- an aperture in said web of insulator material at each said location located centrally of said converging conductive fingers, said aperture being smaller than a semiconductor device to be bonded to said circuit pattern and defined by an opening in said web and a plurality of slots radiating from said opening; and
- each said repetition of said metal pattern being bonded to said flexible insulator material.

* * * * *